SEMICONDUCTOR DEVICE UTILIZING HEAT INJECTION
OF MAJORITY CARRIERS
Filed Dec. 28, 1966 3 Sheets-Sheet 1

Inventor:
REINHARD DAHLBERG
By: Spencer & Kaye
Attorneys

Inventor:
REINHARD DAHLBERG
By: Spencer & Kaye
Attorneys

INVENTOR
Reinhard Dahlberg

BY Spencer & Kaye
ATTORNEYS

United States Patent Office 3,504,240

Patented Mar. 31, 1970

3,504,240
SEMICONDUCTOR DEVICE UTILIZING HEAT INJECTION OF MAJORITY CARRIERS

Reinhard Dahlberg, Heilbronn-Bockingen, Germany, assignor to Telefunken Patentverwertungsgesellschaft m.b.H., Ulm (Danube), Germany Filed Dec. 28, 1966, Ser. No. 605,341
Claims priority, application Germany, Dec. 30, 1965, T 30,179
Int. Cl. H01l *11/00, 15/00*
U.S. Cl. 317—235 21 Claims

ABSTRACT OF THE DISCLOSURE

Two spaced electrodes are joined in a nonrectifying manner to one side of a pn-junction in a semiconductor body, and a voltage is applied between the spaced electrodes to control the current flow across the pn-junction by heat injection of majority carriers.

BACKGROUND OF THE INVENTION

This invention relates to semiconductor devices containing two adjacent regions of opposite conductivity type which form a pn-junction. In the past, it has been known to control the current flow across the pn-junction of a semiconductor by the injection of minority carriers. The object of this invention is to improve the frequency characteristics of semiconductor devices by injecting majority carriers instead of minority carriers.

SUMMARY OF THE INVENTION

The semiconductor device of this invention comprises a semiconductor body containing two regions of opposite conductivity type which form a pn-junction within the semiconductor body, two spaced electrodes joined in a nonrectifying manner to one region on one side of the pn-junction. A third electrode is joined in a nonrectifying manner to the other side of the pn-junction, and a forward or reverse bias voltage is applied across the third electrode and one of the other two electrodes to bias the pn-junction. A second voltage is applied across the spaced pair of electrodes to control the current flow through the pn-junction by heat injection of majority carriers. This permits the frequency characteristics of the semiconductor device to be improved by the injection of majority carriers instead of minority carriers.

The reverse voltage or forward voltage for the pn-junction is applied between one of the spaced pairs of electrodes on one side of the pn-junction and the third electrode on the other side of the pn-junction. The reverse or forward voltage at the pn-junction is selected to be less than or at most equal to the breakdown voltage or the gate voltage of the pn-junction. The direct and/or alternating voltage applied to the spaced pair of electrodes is selected to be not higher than double the Peltier voltage between these nonrectifying electrodes and the thin semiconductor region.

When the nonrectifying contact is made to a semiconductor region of n-type conductivity, the spaced pair of nonrectifying electrodes which contacts the thin semiconductor region may be $n^+$-type regions which are introduced into the semiconductor region and which form part of the surface of the semiconductor body. These $n^+$-type regions may be produced, for example, by diffusion or by alloying. In order that the electrons which are heat-injected from the nonrectifying contact may enter the other region, i.e., the p-type semiconductor region, the n-type semiconductor region must be as thin as possible, for example thinner than $1\mu$.

If the nonrectifying electrodes contact a semiconductor zone of $p^+$-type conductivity instead of a semiconductor zone of n-type conductivity, then the nonrectifying electrodes may be formed by p-type regions introduced into the $p^+$-type semiconductor and may consist, for example, of a semiconductor material different from the $p^+$-type region. These p-type regions are more positive thermoelectrically than the semiconductor zone of $p^+$-type conductivity.

DESCRIPTION OF THE PREFERRED EMBODIMENTS

Figure 1:
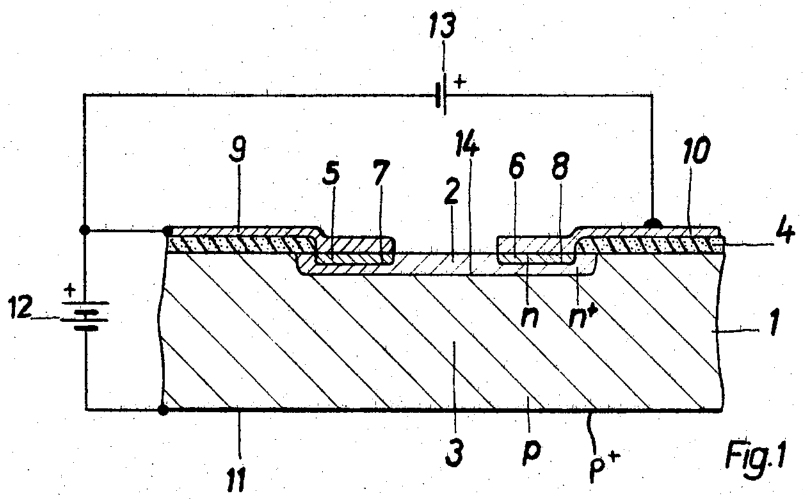
FIGURE 1 is an enlarged cross-sectional view of one embodiment of a semiconductor device according to the invention.

FIGURE 1 shows a semiconductor body 1 with two adjacent semiconductor regions 2 and 3 of $n^+$-type and p-type conductivity, respectively. The semiconductor region 2 of $n^+$-type conductivity is set up by diffusing impurities into the semiconductor body 1, which has p-type conductivity, by means of the planar technique. Semiconductor region 2 is restricted to a limited region of the semiconductor body by providing a diffusion-inhibiting oxide layer 4 on the semiconductor body, and by etching an aperture in this oxide layer 4, which aperture serves as a diffusion window during the diffusion of semiconductor zone 2.

In the example shown in FIGURE 1, nonrectifying electrodes are formed by regions 5 and 6 of n-type conductivity which are set up in the semiconductor zone 2 of $n^+$-type conductivity by diffusion or by alloying. Nonrectifying junctions 7 and 8 are formed at the boundary surfaces between the n-type regions 5 and 6 and the semiconductor region 2 of $n^+$-type conductivity. Contact is made to the n-type regions by means of conducting paths 9 and 10, which extend over the oxide layer 4. Finally, a $p^+$-type contact 11 is provided on the semiconductor body 1, at the side opposite the n-type regions, in order to provide the semiconductor region 3 of p-type conductivity with a nonrectifying contact.

If a voltage is now applied across conducting path 9 and nonrectifying electrode 11 by means of a voltage source 12, which voltage biases the pn-junction 14 between the semiconductor regions 2 and 3 in the reverse direction, and if a voltage, which is not greater than double the Peltier voltage of the thermocouple formed by the two n-type regions 5 and 6 with the $n^+$-type semiconductor region 2, is applied between regions 5 and 6 by means of a voltage source 13, then that n-type contact which is negative with respect to the other n-type contact emits hot electrons which can pass through the thin $n^+$-type semiconductor region 2, which is less than $1\mu$ thick, into the space-charge zone of the pn-junction and on into the p-type region 3 of the semiconductor device. If this part of the injected current multiplied by the voltage across the diode is greater than the total injected current multiplied by the voltage between the two n-type regions 5 and 6, then the device shown in FIGURE 1 is an active four-terminal network.

The device shown in FIGURE 1 and hence also the semiconductor device according to the invention is, in principle, a semiconductor diode with a thermocouple from which hot electrons are injected into the diode. Further pn-junctions may also be present, of course, apart from the one pn-junction. The number of nonrectifying electrodes which make nonrectifying contact with the semiconductor zone of $n^+$-type conductivity is likewise naturally not restricted to two.

Figure 2:
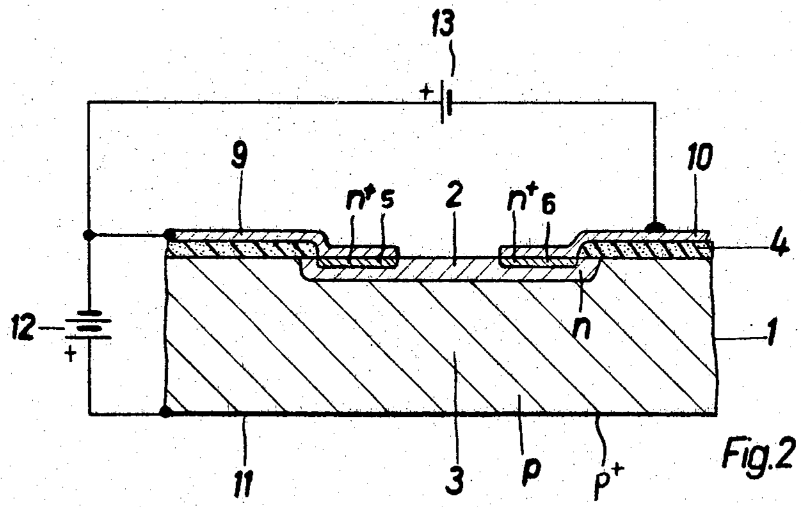
FIGURE 2 is an enlarged cross-sectional view of another embodiment of the invention.

FIGURE 2 shows a semiconductor device according to the invention wherein the pn-junction is not biased in the reverse direction but in the forward direction. The two nonrectifying electrodes 5 and 6 are within a semiconductor region 2 of n-type conductivity and form with the semiconductor region 2 a nonrectifying thermoelectric contact. The semiconductor regions 5 and 6 forming the nonblocking electrodes are more negative thermoelectrically than the semiconductor region 2 of n-type conductivity. This condition is fulfilled, for example, if they consist of an $n^+$-semiconductor material.

Figure 3:
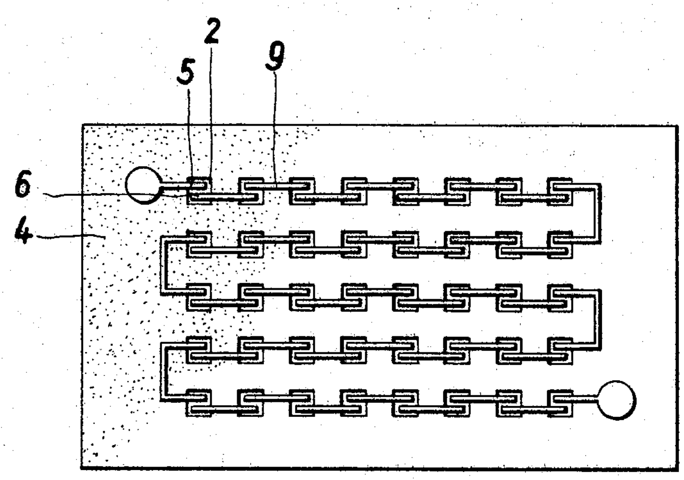
FIGURE 3 is a plan view of a multiple semiconductor device comprising a plurality of semiconductor devices according to the invention.

FIGURE 3 shows a multiple device wherein forty planar diodes according to FIGURE 1 have a common substrate of p-type conductivity, so that the diodes are connected in parallel with one another. The nonrectifying $n^+$-type electrodes 5 and 6, which are in separated p-type semiconductor diode regions, on the other hand, are connected in series, for example by means of vapor-deposited conducting paths 9. Only the semiconductor zones 2 of n-type conductivity, which are surrounded by the silicon dioxide layer 4, can be seen of the diodes in FIGURE 3. The multiple device shown in FIGURE 3 has the advantage that an input voltage can be applied which is up to forty times greater than in the individual device shown in FIGURE 1. This voltage should, however, not be higher than the voltage which appears at the pn-junctions of the diodes connected in parallel.

Figure 4:
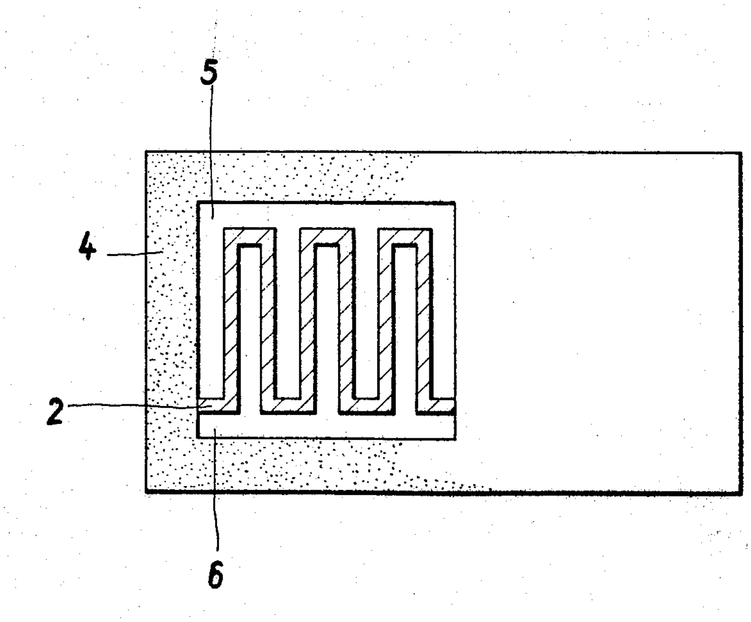
FIGURE 4 is a plan view of another embodiment of the invention having comb-shaped electrodes.
Figure 5:
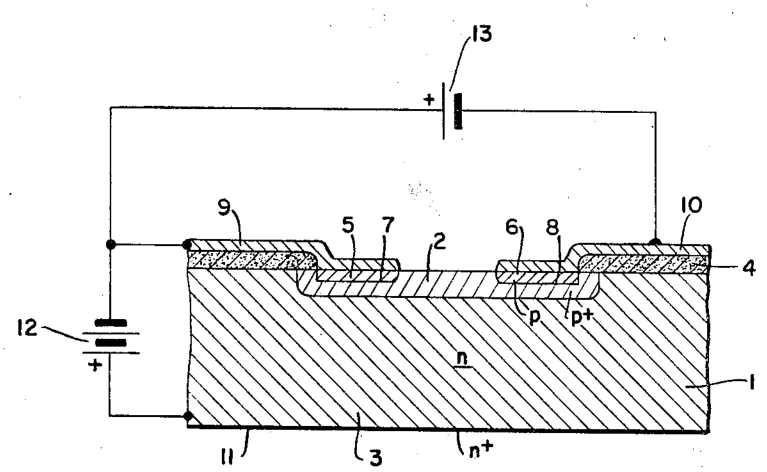
FIGURE 5 differs from FIGURE 1 only by inverse conductivity types of the semiconductor zones.
Figure 6:
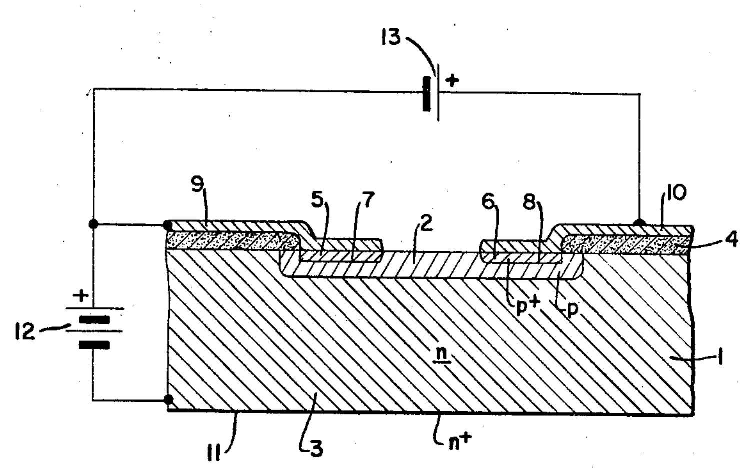
FIGURE 6 differs from FIGURE 2 only by inverse conductivity types of the semiconductor zones.

Finally, FIGURE 4 shows a device wherein the nonrectifying electrodes 5 and 6 have a comb-like structure and interengage in a comb-like manner. The semiconductor body of the diode is below the silicon dioxide layer 4.

In a semiconductor device according to the invention, the semiconductor body may consist, for example, of germanium, of silicon, of a III/VI compound, a II/VI compound, an ion-band semiconductor, or of an organic semiconductor. The semiconductor region which carries the nonrectifying contact may be produced, for example, by diffusion by means of the planar technique, by epitaxy, or by alloying in vapor-deposited metal layers. The semiconductor devices according to the invention are suitable, for example, for use as active four-terminal networks in integrated circuits or in microwave circuits.

The following are illustrative examples of the present invention:

Example 1

In the semiconductor device shown in FIGURE 1, the p-type semiconductor body 1 is made of GaAs and the $n^+$-type region 2 is formed by diffusing Sn into the semiconductor body 1 to a depth of $.1\mu$. The n-type electrode regions 5 and 6 are formed by diffusing Zn into region 2 to a depth of $.03\mu$. Regions 5 and 6 are .05 mm. wide and spaced .01 mm. apart. Typical operating voltages for this particular embodiment of the invention are approximately 10 volts for voltage source 12 and approximately .1 volt for voltage source 13.

Example 2

In the semiconductor device shown in FIGURE 2, the p-type semiconductor body 1 is made of Si and the n-type region 2 is formed by diffusing Sb into the semiconductor body 1 to a depth of $.2\mu$. The $n^+$ electrode regions 5 and 6 are formed by diffusing phosphorus into region 2 to a depth of $.1\mu$. Regions 5 and 6 are .01 mm. wide and spaced .005 mm. apart. Typical operating voltages for this particular embodiment of the invention are approximately 20 volts for voltage source 12 and approximately 1 volt for voltage source 13.

It will be understood that the above description of the present invention is susceptible to various modifications, changes, and adaptations.

I claim:

1. A semiconductor device comprising, in combination:

(a) a semiconductor body containing a first region of one conductivity type and an adjacent region of the opposite conductivity type, said two regions defining a pn-junction within said semiconductor body;

(b) a first and a second electrode each joined to said first semiconductor region and forming a nonrectifying contact with said region; and (c) a third electrode joined to said adjacent semiconductor region and forming a nonrectifying contact with said region;

(d) first voltage-applying means, connected across said first and third electrodes, for biasing said pn-junction; and (e) second voltage-applying means, connected across said first and second electrodes, for heat-injecting (majority) carriers through said pn-junction to control the current flow therethrough.

2. A semiconductor device as defined in claim 1, wherein said first region has n-type conductivity and said adjacent region has p-type conductivity.

3. A semiconductor device as defined in claim 2, wherein said two electrodes which are joined to the n-type region of the semiconductor body comprise third and fourth regions of $n^+$-type conductivity joined to said n-type region in a nonrectifying manner.

4. A semiconductor device as defined in claim 1 wherein said first region has p-type conductivity and said adjacent region has n-type conductivity.

5. A semiconductor device as defined in claim 4 wherein said first and second electrodes comprise third and fourth regions of $p^+$-type conductivity joined to said first p-type region in a nonrectifying manner, said first p-type region forming the n-type element of the thermocouple formed by said third and fourth regions with said first region.

6. A semiconductor device as defined in claim 1, wherein the bias voltage applied to the pn-junction is a reverse bias voltage and is not higher than the breakdown voltage of the pn-junction.

7. A semiconductor device as defined in claim 1, wherein the bias voltage applied to the pn-junction is a forward bias voltage and is not higher than the gate voltage of the pn-junction.

8. A semiconductor device as defined in claim 1, wherein the voltage applied to said first and second electrodes is a direct voltage which is not higher than double the Peltier voltage arising between the said two electrodes and the semiconductor region with which they are in contact.

9. A semiconductor device as defined in claim 1, wherein the voltage applied to said first and second electrodes is an alternating voltage which is not higher than double the Peltier voltage arising between the said two electrodes and the semiconductor region with which they are in contact.

10. A semiconductor device as defined in claim 1, wherein said first semiconductor region has a thickness less than $1\mu$.

11. A semiconductor device as defined in claim 1, wherein said semiconductor body comprises germanium.

12. A semiconductor device as defined in claim 1, wherein said semiconductor body comprises silicon.

13. A semiconductor device as defined in claim 1, wherein said semiconductor body comprises a III/V compound.

14. A semiconductor device as defined in claim 1, wherein semiconductor body comprises a II/VI compound.

15. A semiconductor device as defined in claim 1, wherein said semiconductor body comprises an organic material.

16. A semiconductor device as defined in claim 1, wherein said semiconductor body comprises an ion-band semiconductor.

17. A semiconductor device as defined in claim 1, wherein said first and second electrodes are comb-like in shape and wherein the teeth of one electrode are intermeshed with the teeth of the other electrode.

18. A multiple semiconductor device comprising a plurality of semiconductor devices as defined in claim 1, wherein said adjacent region of the semiconductor body is common to all the individual semiconductor devices, the first region of each individual semiconductor device being separated from the first region of the other semiconductor devices, and the first and second electrodes of the individual semiconductor devices being connected together in series.

19. A multiple semiconductor device as defined in claim 18, wherein said first and second electrodes are connected together in series by means of conducting paths.

20. A multiple semiconductor device as defined in claim 19, wherein said conductive paths are conductive paths which have been formed by vapor-deposition of conducting material on the surface of said semiconductor body.

21. A multiple semiconductor device as defined in claim 19, wherein said second voltage applying means is connected across said series-connected electrodes, the voltage produced by said second voltage-applying means being not higher than double the number of individual semiconductor devices multiplied by the Peltier voltage arising between said first and second electrodes and the semiconductor region to which they are applied.

References Cited

UNITED STATES PATENTS

| | | | |
|---|---|---|---|
| 2,936,425 | 5/1960 | Shockley | 317—235 |
| 3,005,937 | 10/1961 | Wallmark et al. | 317—235 |
| 3,176,153 | 3/1965 | Bejat et al. | 317—235 |

OTHER REFERENCES

Semiconductor Products: "Integrated Semiconductor Networks in Electro-Mechanical Control Systems," by Abbott et al. October 1963. Pages 15 and 16.

JERRY D. CRAIG, Primary Examiner

U.S. Cl. X.R.

307—299